United States Patent [19]

Talreja et al.

[11] Patent Number: 5,539,690
[45] Date of Patent: Jul. 23, 1996

[54] WRITE VERIFY SCHEMES FOR FLASH MEMORY WITH MULTILEVEL CELLS

[75] Inventors: Sanjay S. Talreja, Folsom; Mark E. Bauer, Cameron Park; Kevin W. Frary, Fair Oaks; Phillip M. L. Kwong, Folsom, all of Calif.

[73] Assignee: Intel Corporation, Santa Clara, Calif.

[21] Appl. No.: 252,747

[22] Filed: Jun. 2, 1994

[51] Int. Cl.[6] .................................................. G11C 11/34
[52] U.S. Cl. ........................................ 365/185.22; 365/168
[58] Field of Search ............................... 365/185.22, 168, 365/218, 184, 210, 182, 222, 185.33, 185.3

[56] References Cited

U.S. PATENT DOCUMENTS

| | | | |
|---|---|---|---|
| 4,202,044 | 5/1980 | Beilstein, Jr. et al. | 365/182 |
| 4,287,570 | 9/1981 | Stark | 365/104 |
| 4,388,702 | 6/1983 | Sheppard | 365/104 |
| 4,415,992 | 11/1983 | Adlhoch | 365/94 |
| 4,460,982 | 7/1984 | Gee et al. | 365/189 |
| 4,586,163 | 4/1986 | Koike | 365/104 |
| 4,653,023 | 3/1987 | Suzuki et al. | 354/104 |
| 4,701,884 | 10/1987 | Aoki et al. | 365/189 |
| 4,771,404 | 9/1988 | Mano et al. | 365/189 |
| 4,875,188 | 10/1989 | Jungroth | 365/185 |
| 4,943,948 | 6/1990 | Morton et al. | 365/201 |
| 5,012,448 | 4/1991 | Matsuoka et al. | 365/208 |
| 5,043,940 | 8/1991 | Harari | 365/168 |
| 5,095,344 | 3/1992 | Harari | 357/23.5 |
| 5,163,021 | 11/1992 | Mehrotra | 365/185 |
| 5,172,338 | 12/1992 | Mehrotra | 365/185 |
| 5,218,569 | 6/1993 | Banks | 365/185 |
| 5,260,901 | 11/1993 | Nagase et al. | 365/189.01 |
| 5,283,761 | 2/1994 | Gillingham | 365/189.07 |
| 5,289,412 | 2/1994 | Frary et al. | 365/189.01 |
| 5,297,148 | 3/1994 | Harari | 371/10.2 |
| 5,305,273 | 4/1994 | Jinbo | 365/210 |
| 5,351,210 | 9/1994 | Saito | 365/189 |

*Primary Examiner*—A. Zarabian
*Attorney, Agent, or Firm*—Blakely, Sokoloff, Taylor & Zafman

[57] ABSTRACT

Schemes for verifying the successful programming of a memory cell having more than two possible states are disclosed. Each program verify reference flash cell is set to have a $V_t$ that defines a boundary of a possible state for the selected flash cell. For a first embodiment, program verify reference flash cells are used in the place of read reference cells to perform a binary search read operation similar to a standard read operation for the memory device architecture. The data sensed by the write verify operation is compared to expected data. For a second embodiment, a single program verify reference flash cell is used to define a threshold voltage beyond which the floating gate of the selected flash cell must be programmed to pass the write verify operation. Thus, for the second embodiment, the program verify reference flash cell is used to verify the analog $V_t$ voltage level of the selected flash cell, rather than to determine the data of the selected flash cell, as is done for the first embodiment.

24 Claims, 10 Drawing Sheets

WRITE VERIFY SCHEMES FOR FLASH MEMORY WITH MULTILEVEL CELLS

FIELD OF THE INVENTION

The present invention relates generally to determining the state of a non-volatile semiconductor memory cell and specifically to a write verify scheme for sensing the state of a flash memory cell that stores more than a single bit of data.

BACKGROUND OF THE INVENTION

Non-volatile semiconductor memory devices are fundamental building blocks in prior art computer system designs. The primary mechanism by which data is stored in non-volatile memory is the memory cell. Many prior memory technologies provide a maximum storage capacity of one bit, or two states, per cell. Semiconductor memory cells having more than two possible states are known in the prior art.

One prior flash memory cell is comprised of a single field effect transistor ("FET") including a select gate, a floating gate, a source, and a drain. Information is stored in the flash cell by altering the amount of charge on the floating gate, which causes the threshold voltage $V_t$ of the flash cell to be varied. The flash cell is read by applying a select voltage via a wordline to the select gate. The amount of current which the flash cell conducts when the select voltage is applied is determined by the threshold voltage $V_t$ of the flash cell.

The flash cell can theoretically possess a separate identifiable state for each electron that is added to the floating gate. Practically speaking, however, prior flash cells most often have only two possible states because of inconsistencies in flash cell structure, charge loss over time, thermal considerations and inaccuracies in sensing the charge on the floating gate that affect the ability to determine the data stored in the flash cell. These two states are typically termed "programmed" and "erased," and each state corresponds to a range of $V_t$ voltages. To distinguish between the two possible states, the states are separated by a separation range, which is a range of $V_t$ voltages between the states. When a flash cell is read, the $V_t$ of the flash cell is compared to a reference flash cell having threshold voltage $V_t$ set to a reference voltage that is a voltage in the separation range. A single comparator typically makes the comparison and outputs the result. If the flash cell is programmed, excess electrons are trapped on the floating gate, and the threshold voltage $V_t$ of flash cell has increased such that the selected flash cell conducts less drain-source current than the reference flash cell. The programmed state of the prior flash cell is typically indicated by a logic 0. If the prior flash cell is erased, little or no excess electrons are on the floating gate, and the flash cell conducts more drain-source current than the reference cell. The erased state of the prior flash cell is typically indicated by a logic 1.

Assuming that the flash cell is initially in the erased state, the flash cell is programmed by placing charge on the floating gate such that threshold voltage $V_t$ of the flash cell is increased. Typical prior flash cells are programmed via hot electron injection by applying a source voltage to the source of the flash cell, a programming voltage to the drain of the flash cell, and a voltage to the select gate of the flash cell sufficient to change the amount of charge stored by the flash cell. The source voltage is typically system ground. The programming operation is typically controlled by a control engine or write state machine. Other memory technologies similarly program the memory cell by varying the amount of charge stored in a storage element similar to the floating gate of the flash cell.

For prior art single-bit flash cells, write verify schemes are used to monitor the amount of charge stored in the floating gate of the flash cell when programming the flash cell to insure that the flash cell is, in fact, placed in the "programmed" state and not underprogrammed. Write verify schemes typically involve a series of interleaved write and read operations in which the flash cell is alternately written to and read from to determine whether additional write steps are required. One prior art write verify scheme performs the read operation using a program verify reference cell having its $V_t$ set to a voltage that defines the beginning of the programmed state of the flash cell. Overprogramming is typically not a concern because there are no states beyond the programmed state for single-bit flash cells.

For flash cells having more than two states, the write verify scheme must ensure that the flash cell is neither underprogrammed nor overprogrammed. An underprogrammed flash cell is a flash cell having a threshold voltage $V_t$ that less than the range of $V_t$ voltages for the desired state. An overprogrammed flash cell is a flash cell having a threshold voltage $V_t$ that is greater than the range of $V_t$ voltages for the desired state. Underprogramming and overprogramming can be especially troubling when the flash cell is programmed to have a $V_t$ voltage that lies within a separation range between states. When the $V_t$ of a flash cell is in the separation range it is difficult to reliably determine the data stored in the flash cell.

SUMMARY AND OBJECTS OF THE INVENTION

Therefore, one object of the present invention is to provide a write verify method for verifying the successful programming of a memory cell to a desired state such that the memory cell is not underprogrammed, wherein the memory cell has three or more possible states.

Another object of the present invention is to provide a write verify method for verifying the successful programming of a memory cell to a desired state such that the memory cell is neither underprogrammed nor overprogrammed, wherein the memory cell has three or more possible states.

These and other objects are provided by a method for verifying successful programming of a memory cell having more than two possible states to a desired state. A first reference having a first voltage level that defines a first lower bound of a first state, a second reference having a second voltage level that defines a second lower bound of a second state, and a third reference having a third voltage level that defines a third lower bound of a third state are selected. A programming voltage is applied to the memory cell, and the voltage level of the memory cell is sensed to determine the present state of the memory cell. The voltage level of the memory cell to the first reference, and a first result of comparing the voltage level of the memory cell to the first reference is outputted. The voltage level of the memory cell is then compared to a selected one of the second reference and the third reference in response to the fist result. A second result of comparing the voltage level of the memory cell to the selected one of the second reference and the third reference is outputted. The first result and the second result are compared to an expected value that indicates the desired state. If the first result and the second result are equal to the expected value, successful programming is indicated. If the first result and the second result are not equal to the expected value, the steps of applying the programming voltage to the memory cell, comparing the voltage level of the memory cell to the first reference, outputting the first result, comparing the voltage level of the memory cell to the selected one of the second reference and the third reference, outputting the second result, and comparing the first result and the second result to an expected value are repetitively and sequentially performed until the first result and the second result are equal to the expected value.

These objects are also provided by another method for verifying successful programming of a memory cell. A first reference having a first voltage that defines a lower bound of the predetermined range of voltage levels for the desired state and a second reference having a second voltage that defines an upper bound of the predetermined range of voltage levels for the desired state are selected. A programming voltage is applied to the memory cell, and the voltage level of the memory cell is sensed. The voltage level of the memory cell is compared to the first reference and to the second reference. If the voltage level of the memory cell is greater than the first reference and less than the second reference, the successful programming of the memory cell is indicated.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The various embodiments disclosed herein relate to the use of program verify reference flash cells in the programming and sensing of a flash cell having n possible states, where n is greater than two. Each program verify reference flash cell is set to have a $V_t$ that defines a boundary of a possible state for the selected flash cell. For a first embodiment, program verify reference flash cells are used in the place of read reference cells to perform a binary search read operation similar to a standard read operation for the memory device architecture. The data sensed by the write verify operation is compared to expected data. For a second embodiment, a single program verify reference flash cell is used to define a threshold voltage beyond which the floating gate of the selected flash cell must be programmed to pass the write verify operation. Thus, for the second embodiment, the program verify reference flash cell is used to verify the analog $V_t$ voltage level of the selected flash cell, rather than to determine the data of the selected flash cell, as is done for the first embodiment.

For the purposes of illustration, the memory device discussed in relation to the figures is assumed to be a sixteen output flash EEPROM having a 512 k flash cell array. According to the embodiments of the present invention, each flash cell in the array is capable of being in one of four possible states, and the state of the flash cell is indicated by two binary bits. The array is arranged in 1024 rows and 512 columns, which are subdivided into sixteen data blocks of equal size having 1024 rows and 32 columns each. Components that are common to each embodiment are labeled similarly in order to avoid confusion. This example is not exhaustive of the memory devices in which the method and apparatus of the present invention can be implemented.

Figure 1:
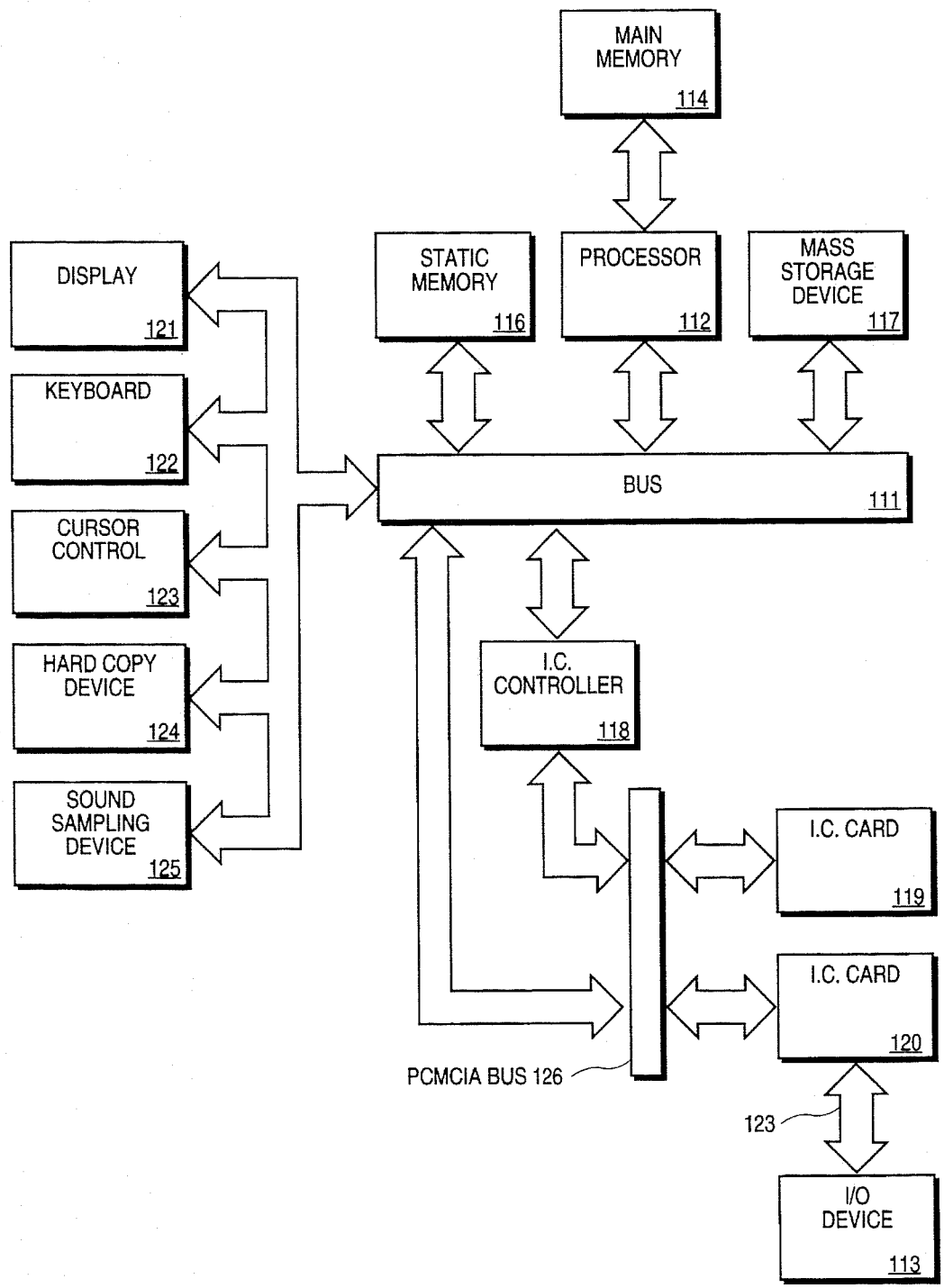
FIG. 1 shows a computer system according to one embodiment.

FIG. 1 shows a computer system of one embodiment. The computer system generally includes a bus 111, to which may be coupled a processor 112, main memory 114, static memory 16, mass storage device 117, and integrated circuit controller 118. Static memory 116 may include a flash electrically eraseable programmable read only memory ("flash EEPROM") or other nonvolatile memory device that stores multiple bits of data per cell. Similarly, mass storage device 117 may be a solid state hard drive 117 using multiple bit per cell nonvolatile memory devices for storing data.

Integrated circuit cards 119 and 120 may be included in the computer system and are coupled to a Personal Computer Memory Card Industry (PCMCIA) bus 126. PCMCIA bus 126 is coupled to bus 111 and to integrated circuit (IC) controller 118 for providing communication information between cards 119 and 120 and the remainder of the computer system. IC controller 118 provides control and address information to IC cards 119 and 120 via PCMCIA bus 126 and is coupled to bus 111.

The computer system may further include a display device 121, a keyboard 122, a cursor control device 123, a hard copy device, and a sound sampling device 125. The specific components and configuration of the computer system is determined by the particular applications for which the computer system is to be used. For example, the computer system of FIG. 1 may be a personal digital assistant (PDA), a pen-based computer system, a mainframe computer, or a personal computer.

Figure 2:
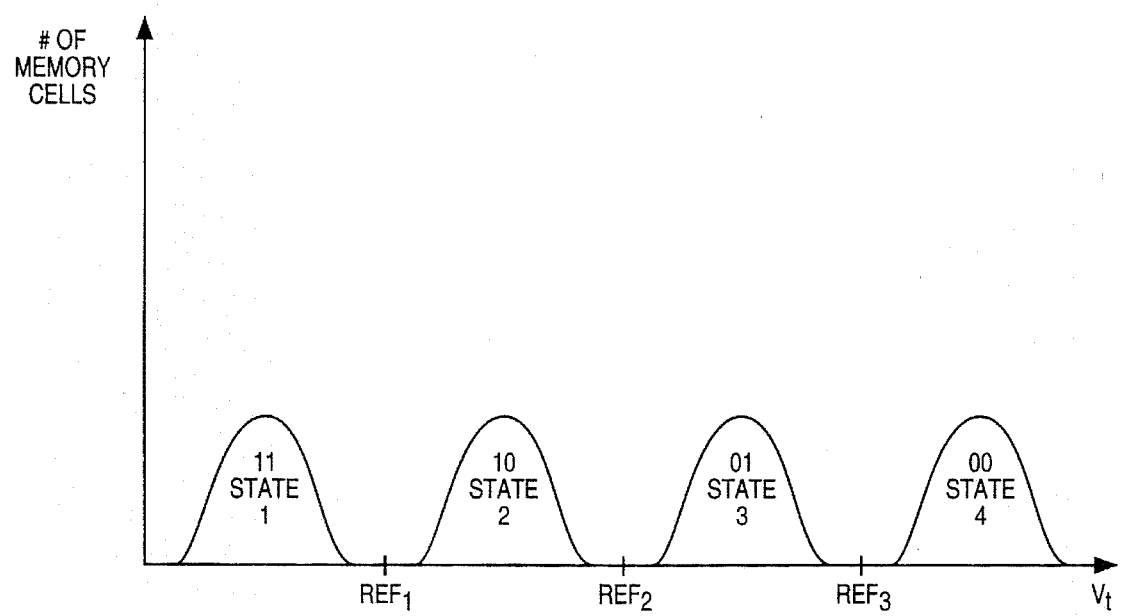
FIG. 2 shows a distribution of multi-level flash cells as a function of $V_t$.

For each embodiment, each memory cell is a flash cell. Each flash cell in the array is capable of being in one of four analog states, and the state of the flash cell is indicated by two binary bits. FIG. 2 shows a distribution of multi-level flash cells as a function of threshold voltage $V_t$. As can be seen, each state is separated by a separation range, and three references, $Ref_1$, $Ref_2$ and $Ref_3$, are provided, one each from the three separation ranges. The references are provided to distinguish between the analog states. State 1 encompasses the lowest range of $V_t$ voltages of the four states and is indicated by both bits being logic 1's (both erased). State 2 is indicated when the high order bit (Bit 1) is a logic 1 and the lower order bit (Bit 0) is a logic 0. State 3 is indicated by Bit 1 being a logic 0 and Bit 0 being a logic 1. State 4 is indicated by both bits being logic 0's (both programmed). The number n of possible states is not limited to four. For example, the number of states can be three, five, sixteen, etc. Further, the mapping of binary bits to analog states may be varied. For example, the lowest range of $V_t$ voltages can be indicated by both bits being logic 0's.

It should be noted that nonvolatile memory devices other than flash EEPROM's and volatile memory devices such as Dynamic Random Access Memories (DRAM) are potentially capable of storing three or more analog states. Further, it should be noted that the analog states of nonvolatile devices having a floating gate may be expressed in terms other than the threshold voltage $V_t$. For example, analog states may be expressed as ranges of threshold voltages $V_t$ as shown in FIG. 2, as ranges of drain currents $I_D$, or as ranges of charge stored on the floating gate. Volatile memory cells such as DRAM memory cells are typically comprised of a capacitor and may similarly be expressed as ranges of charge, currents or voltages.

A nonvolatile memory cell that has a floating gate behaves as a field effect transistor having a threshold voltage $V_t$ that increases as charge is added to the floating gate. The memory cell drain current $I_D$ ("cell current") decreases as the threshold voltage Vt and cell charge level increase. The memory cell threshold voltage $V_t$ is related to the memory cell drain current $I_D$ by the expression:

$$I_D \alpha G_m \times (V_G - V_t) \text{ for } V_D > V_G - V_t$$

$G_m$ is the transconductance of the memory cell;

$V_G$ is the memory cell gate voltage;

$V_D$ is the memory cell drain voltage; and $V_t$ is the memory cell threshold voltage.

Given this relationship, there are a number of ways to sense the amount of charge stored on of the floating gate of the memory cell, including the following: sensing the cell current of a memory cell when a constant voltage is applied to the select gate of the memory cell; sensing the amount of voltage required at the select gate to give rise to an expected cell current for the memory cell; sensing a voltage drop across a load that is coupled to the drain of the memory cell when a constant voltage is applied to the select gate of the memory cell, wherein the cell current determines the amount of the voltage drop across the load; and sensing the amount of voltage required at the select gate to give rise to an expected voltage drop across a load that is coupled to the drain of the memory cell. To determine the analog state of the memory cell, however, it is not necessary to quantify the precise amount of charge stored on the floating gate. It is sufficient to compare a characteristic of the memory cell to a known reference.

One type of reference is a reference memory cell programmed to have a known threshold voltage $V_t$. Sensing circuitry for the memory cell may be replicated for the reference memory cell and the outputs of the sensing circuitry and reference sensing circuitry may be compared using a differential comparator. Because sensing the cell charge level of a memory cell typically requires the comparison of either voltages or currents, the reference may be equivalently provided by using voltage supplies or current sources to supply voltages or currents that correspond to reference memory cells having a cell charge level between defined analog states. For this reason, the references $Ref_1$, $Ref_2$, and $Ref_3$ are not specified as being threshold voltages, cell currents, or levels of charge stored on a floating gate. Instead, it is to be understood that the references shown in FIG. 2 correspond to the characteristics of the memory cell as defined by the relationship between cell charge level, cell current $I_D$, and threshold voltage $V_t$. For the purposes of simplifying the remaining discussion, the references $Ref_1$, $Ref_2$, and $Ref_3$ will expressed as threshold voltages $V_{R1}$, $V_{R2}$ and $V_{R3}$, respectively.

Figure 3:
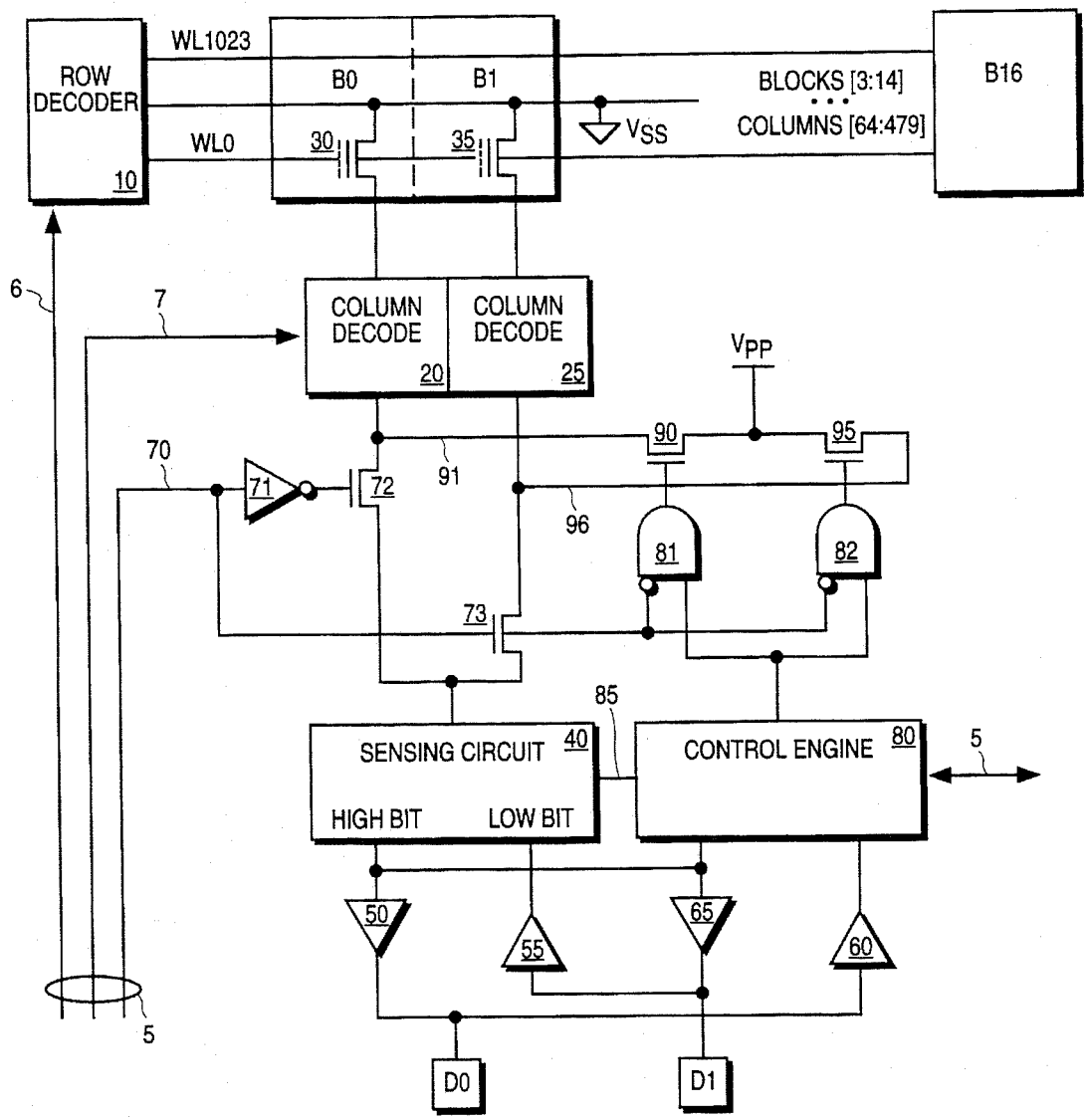
FIG. 3 illustrates a by-output sense and write path architecture according to a first embodiment.

FIG. 3 illustrates a by-output sense and write path architecture for implementing write verify schemes according to a first embodiment. The by-output architecture is designed to allow accessing of the m bits contained in a selected flash cell in a single clock cycle. The number of bits "m" is equal to $\log_2 n$. The architecture is said to be "by-output" because each bit in a cell is mapped to a unique output. Although FIG. 3 illustrates a sense and write path architecture for the case where two bits are stored per cell, the architecture may be readily adapted to provide the accessing of flash cells that store m bits.

In this sense path architecture, m outputs are provided per selected flash cell. In this manner, one address is used to select a single cell. The mapping between data blocks and outputs, however, is not a one-to-one correspondence. In the example of FIG. 3, there are 16 data blocks, B0–B15, only eight of which are coupled to the sixteen outputs, D0–D15, at any one time.

For a two-bit per cell array, if the number of a flash cells in the array is to remain at 512 k such that the increased density of the dual-bit flash array is fully utilized, one extra address line is preferably added over the number of address lines typically required for accessing single-bit flash cell arrays. The number of address lines that must be added is a function of the increased memory space provided by the multi-bit cell. For every doubling of memory space, or portion thereof, one address line is preferably added. For odd numbers of bits, such as three bits per cell, the added address line results in the address space being larger than the accessible memory space. Thus, a four-bit per flash cell array would have the same number of address lines as the three bit flash cell array, but the address space and the memory space would be co-extensive. If the size of the array is halved in order to reduce the size of a typical 512 k flash memory device, no additional address line is required for a dual-bit flash cell array.

In this example, the floating gate of each selected flash cell is charged to a voltage level corresponding to one of four possible states, which can be expressed using two binary bits. The state of a floating gate can be determined using a constant select voltage/variable cell current sensing scheme wherein a constant and predetermined select voltage is applied to the select gate of a flash cell each time the flash cell is read. The state of the flash cell is determined by comparing the cell current of the flash cell to the cell current of a reference cell (not shown) when the same select voltage is applied to the flash cell and the reference cell. As discussed above, the threshold voltages $V_t$ of the flash cell determines the cell current of the flash cell when the select voltage is applied to the select gate.

In FIG. 3, the user provides an address that the row decoder 10 and the column decoders, which include column decoders 20 and 25, decode to select sixteen flash cells, one each from data blocks B0 to B15. The address is provided via address lines 5, which include row address lines 6, column address lines 7, and MLC address line 70. The state of MLC address line 70 determines which eight flash cells will be coupled to the sixteen outputs. Selected flash cells 30 and 35 are two of the sixteen flash cells selected in response to the address decoding operation of the row and column decoders. Flash cell 30 is selected in data block B0. Flash cell 35 is selected in data block B1. The drains of the selected flash cells 30 and 35 are coupled to the sense path circuit via column decoders 20 and 25, respectively.

The by-output sense path circuit includes a circuit for selecting between the selected flash cells 30 and 35 in response to the address bit of the MLC address line 70, a sensing circuit 40 that senses the state of the finally selected flash cell and outputs two binary bits indicating that state, and output buffers 50 and 55, each of which outputs one of the binary bits to the output of the memory device. The circuit for selecting between the selected flash cells 30 and 35 includes inverter 71, and n-channel FETs 72 and 73.

The state of the added MLC address line 70 determines whether the high word of the array, which is the sixteen bits stored in the odd-numbered data blocks B1–B15, or the low word of the array, which is the sixteen bits stored in the even-numbered data blocks, B0–B14, is routed to the outputs of the memory device. The added address line is shown as signal line 70, which is coupled to the input of inverter 71 and the gate of n-channel FET 73. When the address bit is a logic 0, the inverter 71 presents a logic 1 to the gate of n-channel FET 72. FET 72 switches on, coupling the sensing circuitry 40 to the column decode 20 of the data block B0, which stores two bits of the low word. When the address bit is logic 1 the sensing circuit 40 is coupled to the column decode 25 of the data block B1, which stores two bits of the high word. The signal line 70 is coupled to similar circuitry for the remaining pairs of data blocks such that a total of eight flash cells are selected from eight data blocks to output sixteen bits of data. One alternative to the present embodiment is to subdivide the array into eight data blocks each having 64 columns. The added address line can then be incorporated in the column decode circuitry. In this manner, the column decode circuitry directly selects the desired flash cell without resorting to an additional selecting circuit such as that which includes inverter 71 and FETs 72 and 73.

When the address bit of MLC address line 70 is a logical 0, the flash cell 30 is coupled to the sensing circuit 40. For a read access, the sensing is preferably performed using a binary search sensing scheme as described below with reference to FIGS. 4A and 4B. The sensing circuit outputs the high order bit Bit 1 to the output buffer 50 and the low order bit Bit 0 to the output buffer 55. The output buffers 50 and 55 output the data to outputs D0 and D1, respectively. The specific mappings of bits to outputs is not limited to contiguous outputs and can be determined according to the needs of the system. For example, the high order bit Bit 1 can be routed to output D0 and the low order bit B0 can be routed to output D7.

Figure 5:
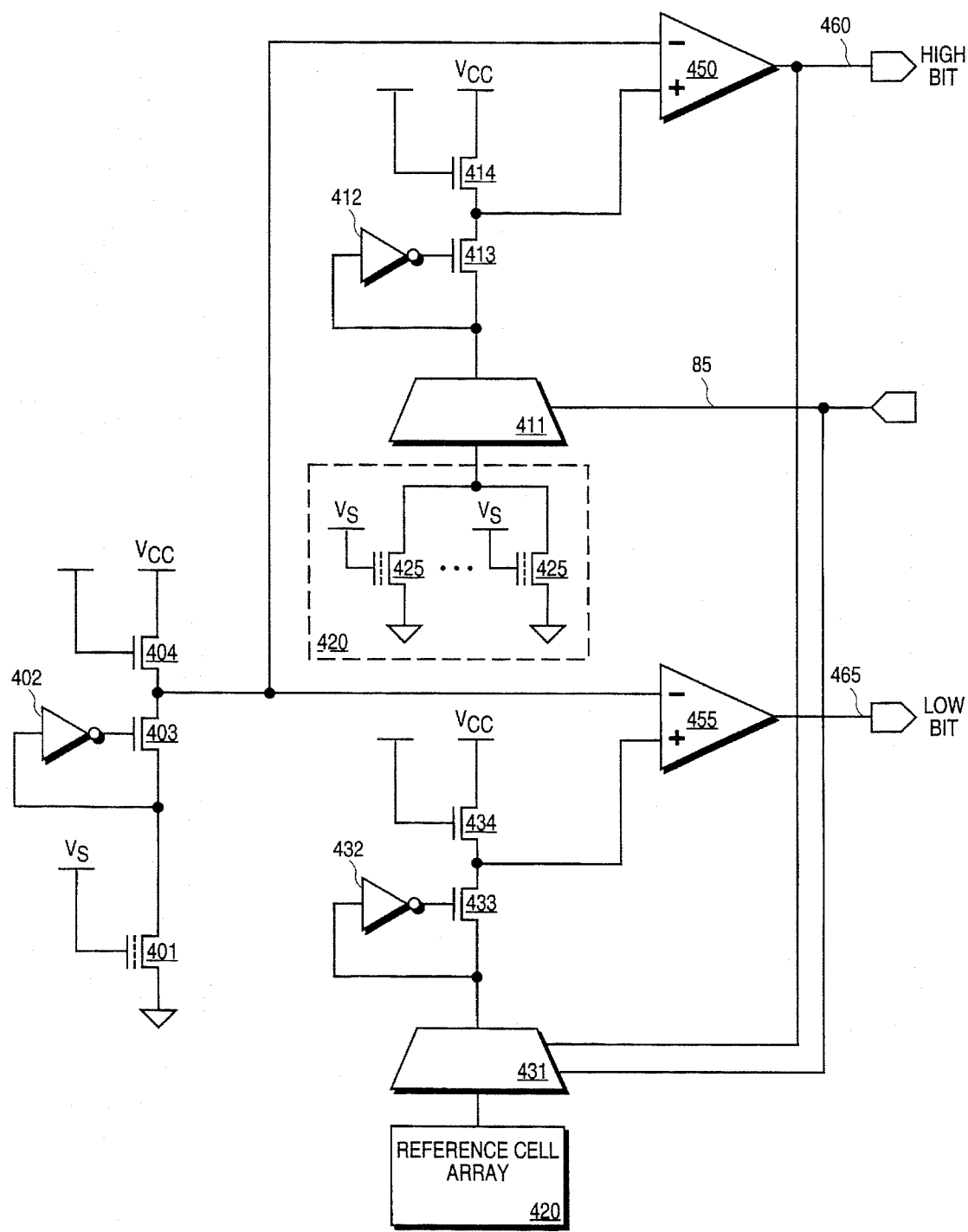
FIG. 5 illustrates a sensing circuit that implements a binary search scheme for sensing the state of a flash cell having four possible states.

FIG. 3 also shows a by-output write path architecture, which includes input buffers 60 and 65, control engine 80, AND gates 81 and 82, and n-channel FETs 90 and 95. The drains of the selected flash cells 30 and 35 are coupled to the write path circuit via column decoders 20 and 25, respectively. Control engine 80 controls the erasure of the flash array. Control engine 80 also controls the programming of multilevel cells, which will be described in detail herein below. Control engine 80 manages the flash array via control of row decoder 10, column decoders 20 and 25, sensing circuit 40, an array of reference cells (as shown in FIG. 5) and voltage switch circuitry (not shown). The address lines 5 are shown as being coupled to the control engine 80. The voltage switch circuitry controls the various voltage levels necessary to read, program and erase flash array. $V_{PP}$ is the program/erase voltage, which must be high in order to program or erase data stored within the flash array. $V_{PP}$ may be externally supplied or internally generated. User commands for reading, erasure, and programming are communicated to control engine 80 via a command interface (not shown). The control engine 80 may be a processor or state machine that is internal to the memory device, but the function of the control engine can be performed by control circuitry external to the memory device. A similar write path circuit is provided for every n outputs.

Each of the FETs 90 and 95 has its drain coupled to the programming voltage supply VPP and its source coupled to the respective selected flash cell. When a logic high voltage is received at the gate of FETs 90 or 95, the drain path of the respective selected flash cell is coupled to the programming voltage supply VPP. The voltage levels applied to the gates of FETs 90 and 95 are determined by AND gates 81 and 82 in response to the address bit of MLC address line 70 and the output of the control engine 80.

TABLE 1

| EXTERNAL DATA | | |
|---|---|---|
| Bit 1 | Bit 0 | STATE |
| 1 | 1 | STATE 1 |
| 1 | 0 | STATE 2 |
| 0 | 1 | STATE 3 |
| 0 | 0 | STATE 4 |

For a write access, every two external bits are coded into one of four programming levels that correspond to each of the four possible states by the control engine 80. The two external bits are received from the D0 and D1 I/O pads via input buffers 60 and 65. This encoding may be done according to the truth table of Table 1. The programming level is then used to set the threshold voltage $V_t$ of a selected flash cell. The primary mechanism for placing charge on the floating gate is hot electron injection, and voltage switching circuitry (not shown) uses the programming voltage supply VPP to generate a gate voltage and a drain voltage to apply to the selected flash cell during programming pulses. The source of the selected flash cell is typically grounded during programming. The control engine 80 sets the threshold voltage $V_t$ of the selected cell through a series of programming pulses during which the programming voltages derived from the programming voltage supply VPP are applied to and removed from the selected flash cell several times. It is possible that a selected flash cell can successfully program in one programming pulse. The amount of charge placed on the floating gate of the selected cell is varied by varying the gate or wordline voltage level from programming pulse to programing pulse.

During the write access, the MLC address line 70 is used to route the 16-bit encoded data into the high or low order word. As can be seen, the MLC address line 70 is coupled as an input to AND gates 81 and 82. The address bit input is inverted for the AND gate 81. The second input for each AND gate is the output of the control engine. Depending on the state of the MLC address line 70, a logic 1 output by the control engine 80 will cause either FET 90 or 95 to be switched on, coupling the programming voltage VPP to selected flash cells 30 and 35, respectively. If the address bit is high, the high order word (the odd-numbered data blocks) will be programmed. The control engine for each write path determines the programming level of the selected flash cell. In this embodiment, there are a total of sixteen write paths.

To accommodate write verify operations, the inputs of the control engine 80 are coupled to the outputs of the sensing circuit 40. In addition, a control signal is coupled to the sensing circuit via signal line 85 to select the appropriate reference cells for the write verify operation.

Figure 4A:
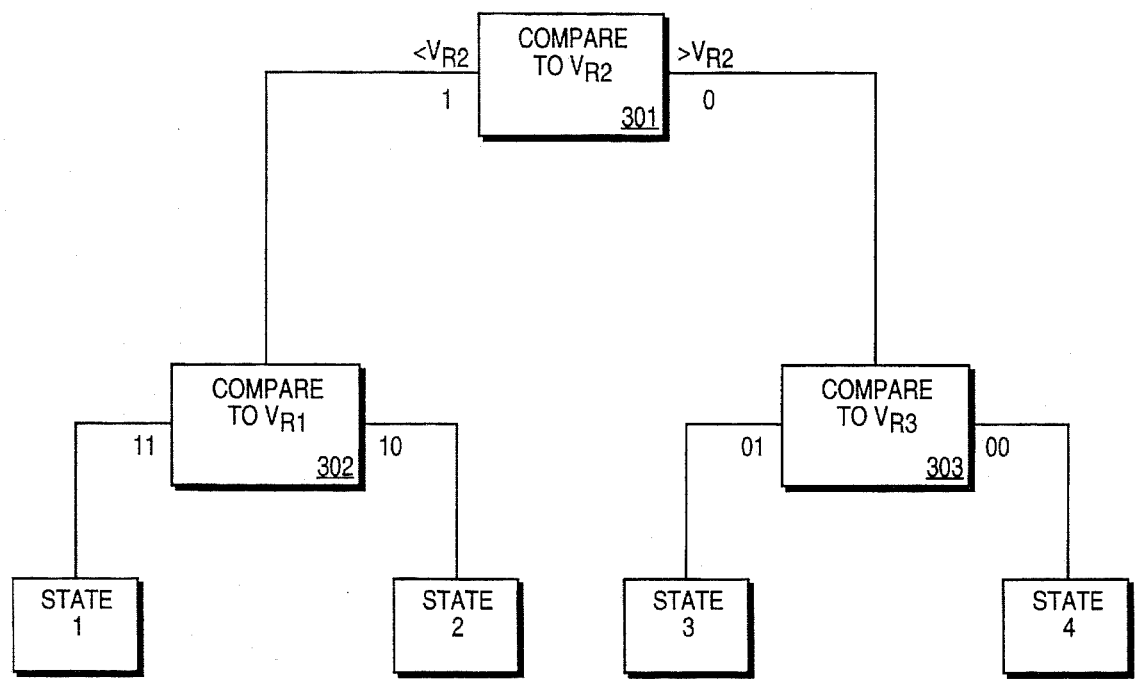
FIG. 4A is a flow chart for a binary search sensing scheme.
Figure 4B:
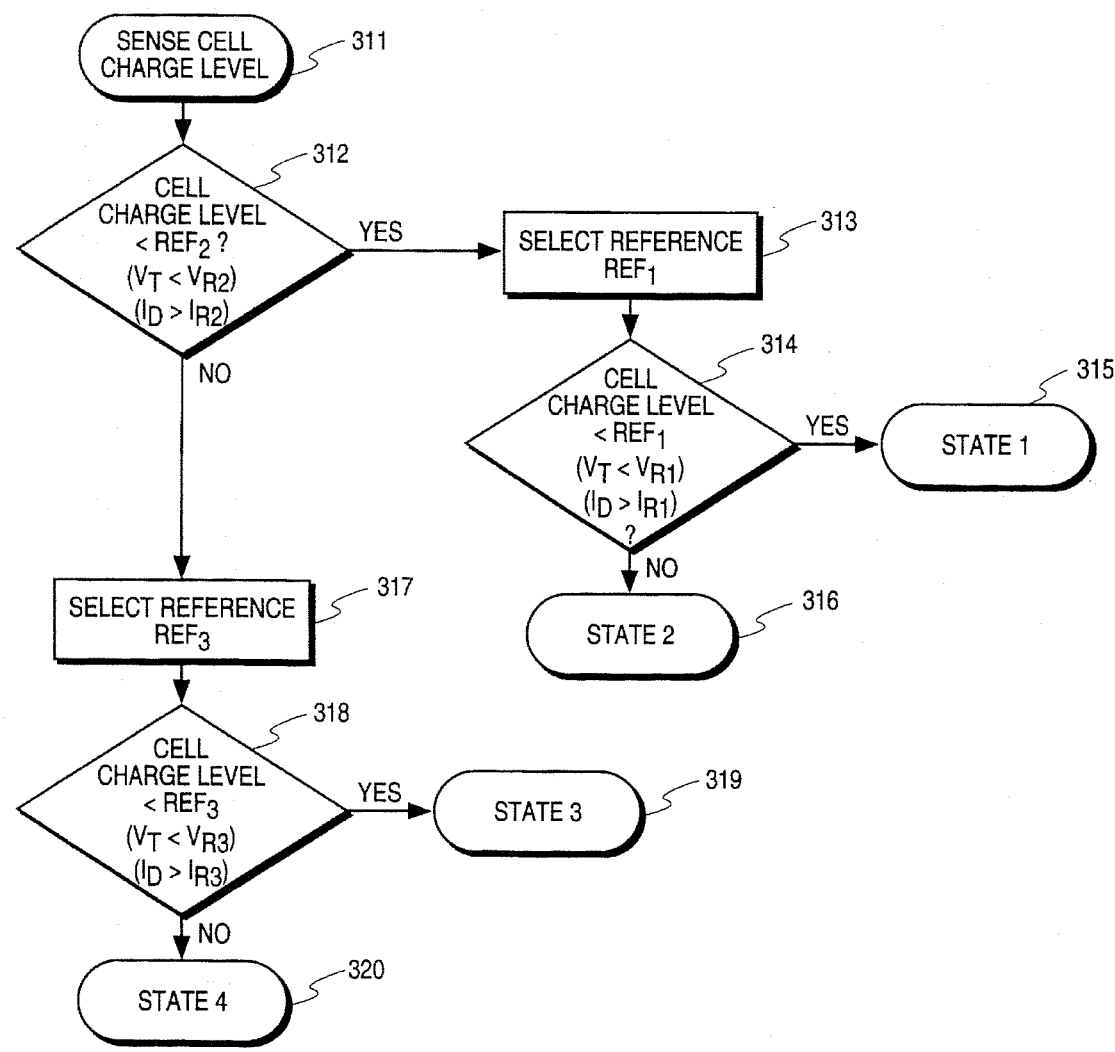
FIG. 4B is a more conventional flow chart for a binary search sensing scheme.

For a standard read access, the sensing circuit 40 is configured to perform a binary search as shown in FIGS. 4A and 4B. FIG. 4A is a block diagram showing a binary search method for determining the state of a memory cell having more than two possible states. In step 301, the cell charge level of the selected cell is sensed and compared to a first reference flash cell having its $V_t$ equal to $V_{R2}$. Depending on the result of the initial comparison, the sensed cell charge level of the selected cell is compared to a selected one of a second reference flash cell having its $V_t$ equal to $V_{R1}$ and a third reference flash cell having its $V_t$ equal to $V_{R3}$. If the sensed cell charge level of the selected flash is less than that of the first reference flash cell, the sensed cell charge level is compared to the second reference flash cell at step 2, and the selected flash cell is either in state 1 or state 302. If the sensed cell charge level of the selected flash is greater than that of the first reference flash cell, the sensed cell charge level is compared to the third reference flash cell at step 303, and the selected flash cell is either in state 3 or state 4. Sensing of the cell charge level may be done according to any of the methods previously discussed.

FIG. 4B is a conventional flow chart showing the binary search method of the present embodiment. At step 311, the cell charge level of the memory cell is sensed. At step 312, it is determined whether the cell charge of the memory cell is less than the cell charge level of the reference $Ref_2$. If the cell charge level of the memory cell is less than the cell charge level of the reference $Ref_2$, the threshold voltage $V_t$ of the memory cell is less than that of a reference memory cell having a $V_t$ equal to $V_{R2}$. Similarly, the cell current $I_D$ of the memory cell is greater than the cell current $I_{R2}$ of a reference memory cell having a cell current of $I_{R2}$. If the cell charge level of the memory cell is less than the cell charge level of reference Ref2, Ref1 is selected at step 313. At step 314, it is determined whether the cell charge of the memory cell is less than the cell charge level of the reference $Ref_1$. If the cell charge level of the memory cell is less than the cell charge level of the reference $Ref_1$, the memory cell is indicated as being in state 1 at step 315. If the cell charge level of the memory cell is greater than the cell charge level of the reference $Ref_1$, the memory cell is indicated as being in state 2 at step 316.

If the cell charge level of the memory cell is less than the cell charge level of reference $Ref_2$, $Ref_3$ is selected at step 317. At step 318, it is determined whether the cell charge of the memory cell is less than the cell charge level of the reference $Ref_3$. If the cell charge level of the memory cell is less than the cell charge level of the reference $Ref_3$, the memory cell is indicated as being in state 3 at step 319. If the cell charge level of the memory cell is greater than the cell charge level of the reference $Ref_3$, the memory cell is indicated as being in state 4 at step 320.

FIG. 5 shows a sensing circuit for determining the state of a memory cell having more than two possible states. This circuit implements the method of FIGS. 4A–4B. The circuit uses a constant-gate-voltage/variable-cell-current sensing scheme wherein a constant biasing voltage $V_S$ is applied to the select gates of a selected flash cell 401 and reference flash cells 486, 487 and 488. The state of the selected flash cell 401, as a function of the level of charge on floating gate 142 of the flash cell 141, is determined by comparing the cell current of the selected flash cell 401 to the reference cell currents of a reference flash cell 486 and a selected one of the reference flash cells 487 and 488. To sense the respective cell currents, a load is coupled to the drains of the respective flash cells to give rise to a voltage drop. In this manner, the cell charge level of the selected flash cell is sensed and used to determine the analog state of the selected flash cell.

The state of the selected flash cell determines the voltage at node 405, which is the drain of FET 403. The negative terminals of comparators 450 and 455 are both coupled to node 405 for sensing the voltage resulting from applying the biasing voltage $V_S$ to the select gate of the selected flash cell 401, which conducts a cell current when the biasing voltage $V_S$ is applied. The level of charge on the floating gate of the selected flash cell 401, as indicated by the $V_t$ of the selected flash cell, determines the amount of cell current. As $V_t$ increases, the cell current decreases. Conversely, the current increases as $V_t$ decreases. Thus, if the selected flash cell 401 is in state 1, the voltage at node 405 is less than if the selected flash cell 401 is in state 2.

Comparator 450 has its positive terminal coupled to a first reference circuit that includes a column load FET 414, a drain bias circuit including inverter 412 and FET 413, and a selected one of the reference flash cells 425 of the reference cell array 420 that includes a plurality of reference flash cells each having a predetermined threshold voltage $V_t$. The selection is made by the selecting circuit 411 in response to the state of the control signal line 85. The voltage at node 415 is determined by the cell current of a reference flash cell 425 selected by the selecting circuit 411. The positive terminal of sense amplifier 455, is coupled to a second reference circuit that includes column load FET 434, a drain bias circuit including FET 433 and inverter 432, and a selected one of a reference cell array 420 including reference flash cells 425. The selection among the various reference cells 425 is made by a selecting circuit 431 in response to the output of sense amplifier 450 and the control signal from signal line 85. The column load FETs 414 and 434 of the reference circuits are preferably identical to the column bias FET 404. Similarly, the drain bias circuits are preferably identical. Each of the first and second reference circuits can include an individual reference cell array 420, or the reference circuits can share a single reference cell array 420. One method is to provide a single reference cell array 420 for use by all of the sensing circuits in the memory device. For further discussion of a reference cell array, see U.S. Pat. No. 5,289,412, of Frary et al., commonly assigned to Intel Corporation of Santa Clara, Calif.

Figure 6:
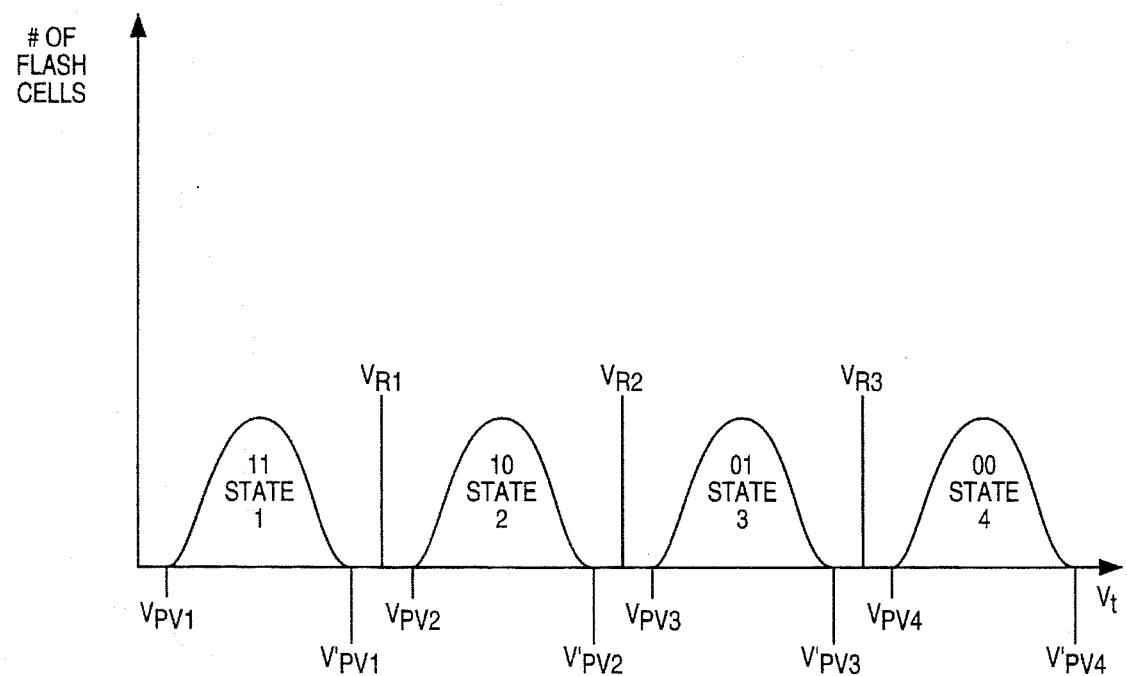
FIG. 6 shows the placement of program verify and read reference voltages in the distribution of multi-level flash cells as a function of $V_t$.

The $V_t$ values of the reference cells of FIG. 5 will now be discussed with respect to FIG. 6, which illustrates a distribution of flash cells as a function of $V_t$. The reference cell array 420 may include as many as eleven reference cells 425, depending on the specific embodiment, each reference cell 425 having its floating gate set to a unique $V_t$ as defined in FIG. 6. The possible $V_t$ voltages for the reference flash cells 425 include read reference ("R") voltages $V_{R1}$, $V_{R2}$, and $V_{R3}$, and program verify ("PV") voltages $V_{PV1}$, $V_{PV2}$, $V_{PV3}$, $V_{PV4}$, $V_{PV1'}$, $V_{PV2'}$, $V_{PV3'}$, and $V_{PV4'}$.

The primed and unprimed PV voltage levels are program verify voltages that delineate the outer bounds of a range of $V_t$ voltages that defines a single state. The unprimed PV levels define lower boundaries, and the primed PV levels define the upper boundaries. Thus, $V_{PV2}$ defines the smallest $V_t$ value a flash cell can have to be in state 2, and $V_{PV2'}$ defines the largest $V_t$ value a flash cell can have to remain in state 2. Program verify reference flash cells are used to guarantee the existence of a separation range for accurate determination of the data stored in the flash array. The voltage levels designated with an "R" are the standard read reference voltages that are placed in the separation ranges between states.

Returning to FIG. 5, during a standard read operation, the select circuitry 411 selects a first reference flash cell that has a $V_t$ equal to $V_{R2}$. Select circuitry 431 is configured to respond to the output of comparator 450 as received via signal line 460 to determine whether a second reference flash cell having a $V_t$ equal to $V_{R1}$ or a third reference flash cell having a $V_t$ equal to $V_{R3}$ is coupled to the node 435 via FET 433. Select circuitry 431 selects the second reference flash cell if the output of the comparator 450 is a logic 1, indicating that the $V_t$ of the selected flash cell 401 is less than $V_{R2}$. The third reference flash cell is selected if the output of the comparator is a logic 0.

The state of the signal line 85 becomes important during a write verify operation. As discussed above with respect to FIG. 3, after a programming pulse is applied to the selected flash cell, the control engine 80 performs a write verify operation by sensing the state of the selected flash cell. This may be done by reading the data stored in the selected flash cell by using selected PV reference flash cells and comparing the result of that read operation to expected data for the cell. This may be thought of as a "random data sense" write verify scheme. Alternatively, the state of the selected flash cell can be determined by comparing the analog $V_t$ voltage level of the selected cell to that of a selected unprimed PV reference flash cell. This may be thought of as a "level verify" write verify scheme. For prior art single-bit flash cells, "level verify" and "random data sense" are typically synonymous concepts because the determination between two states and the determination of whether a threshold voltage has been reached both require the use of a single comparator.

For multiple-bit memory devices, the choice between level verify and random data sense schemes may lead to architectural differences for a memory device that simultaneously programs several memory cells in parallel. Random data sense schemes are advantageous in that a single set of reference memory cells may be selected for the entire memory device during programming. For the example of the sixteen output flash EEPROM, eight flash cells may be programmed at the same time, and the same set of reference flash cells may be used to program all 512 k flash cells of the device. By contrast, level verify schemes require the selection of a reference memory cell for each memory cell to be programmed. For the example of the sixteen output flash EEPROM, a new set of reference flash cells may have to be selected for every eight flash cells that are programmed in parallel.

Figure 7:
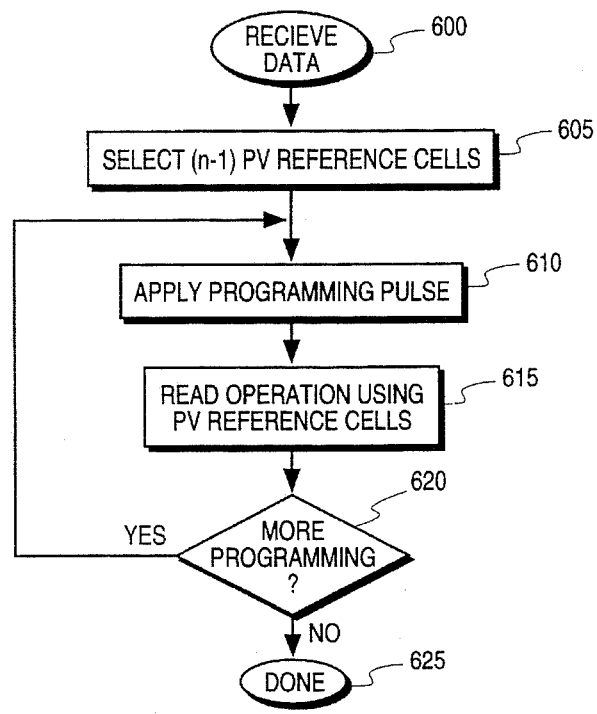
FIG. 7 is a flow chart for performing a random data sense write verify method.

A first method for performing a write verify operation for a multi-bit flash cell is shown in FIG. 7. In this method, a binary search read operation is performed using (n–1) program verify reference cells in the place of the (n–1) read reference cells utilized in the standard read operation. Thus, the write verify method of FIG. 7 is a random data sense write verify method. The reference flash cells selected preferably each have a $V_t$ level equal to an unprimed PV voltage. The unprimed voltage for the lowest state (State 1) is not necessary for determining the state of the selected flash cell because an erased cell is assumed to be in State 1. For the case of a two-bit per cell flash array, the comparator 450 is coupled to a first reference flash cell having a $V_t$ equal to VPV3, and the comparator 460 is selectively coupled to a second reference flash cell having a $V_t$ equal to $V_{PV2}$ or a third reference flash cell having a $V_t$ equal to $V_{PV4}$ in response to the output of comparator 450. At step 600, data is received and stored by the control engine 80, and the data is encoded into a programming level as described above. At step 605, the control engine 80 selects the (n–1) program verify reference flash cells as described above by asserting the signal line 85. At step 610, the control engine 80 applies a programming pulse to the selected flash cell. At step 615, the data stored in the selected flash cell is sensed by the sensing circuit 40 using the binary search read method with the selected PV reference flash cells. At step 620, the sensed data of the selected flash cell is compared to the expected data, which is the received data that has been stored. If the data is not equal to the expected data, steps 610–620 are repeated. If the data is equal to the expected data, the selected flash cell is properly programmed, and the cell passes the write verify operation at step 625. The width of the programming pulse is preferably chose such that the application of a single programming pulse typically does not cause the $V_t$ of the selected flash cell to cross more than a single state. Further, the control engine 80 preferably ceases the application of programming pulses after a predefined number of programming pulses have been applied to a selected flash cell.

Figure 8:
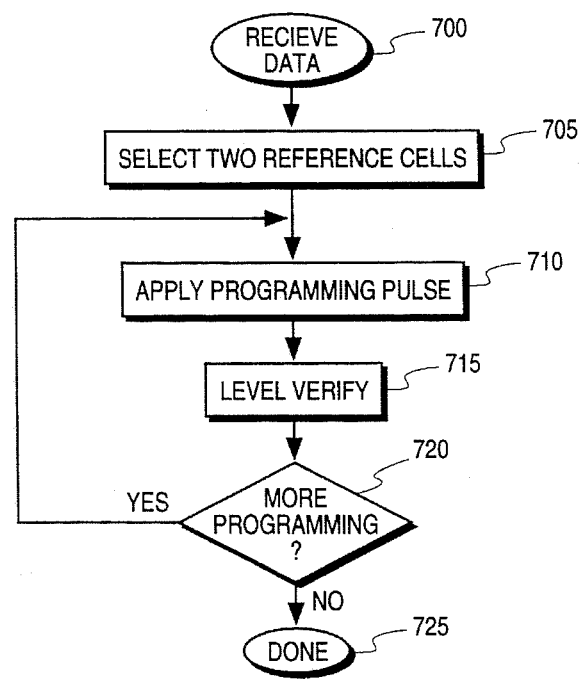
FIG. 8 is a flow chart for performing a level verify write verify method incorporating an overprogram sense scheme.

Another method for performing a write verify operation for a multi-bit flash cell is shown in FIG. 8. This write verify operation is a level verify scheme combined with an overprogram sense scheme. At the beginning of a write operation at step 700, data is received by the control engine 80 via input buffers 60 and 65. The control engine 80 encodes this data to provide the appropriate programming levels as discussed above. At step 705, the control engine 80 selects two PV reference flash cells via signal line 85. One PV reference cell is selected for each comparator 450 and 455. The first PV reference cell coupled to the comparator 450 is an unprimed PV cell for a state, and the second PV reference cell coupled to the comparator 455 is a primed PV cell for the same state. For example, if the data to be programmed is "01," the selected cell must be programmed to state 3 and the comparator 450 has its positive terminal coupled to a reference flash cell which has a $V_t$ of $V_{PV3}$ via FET 413 and selecting circuit 411. The comparator 455 has its positive terminal coupled to a reference flash cell which has a $V_t$ of $V_{PV3'}$ via FET 433 and selecting circuit 431. Because the comparator 450 may only be coupled to unprimed PV reference flash cells and the comparator 455 may only be coupled to primed PV reference flash cells, the expected output for each comparator is identical regardless of the desired state for the selected flash cell. This is shown in Table 2.

TABLE 2

| LEVEL | REFERENCE FOR COMPARATOR 450 | REFERENCE FOR COMPARATOR 455 | OUTPUT OF COMPARATOR 450 TO PASS PROGRAM | OUTPUT OF COMPARATOR 455 TO PASS PROGRAM |
|---|---|---|---|---|
| STATE 1 | $V_{PV1}$ | $V_{PV1'}$ | 0 | 1 |
| STATE 2 | $V_{PV2}$ | $V_{PV2'}$ | 0 | 1 |
| STATE 3 | $V_{PV3}$ | $V_{PV3'}$ | 0 | 1 |
| STATE 4 | $V_{PV4}$ | $V_{PV4'}$ | 0 | 1 |

At step 710 a programming pulse of a predetermined duration is applied to the selected flash cell. At step 715, the state of the selected flash cell is sensed and compared to the expected value of "01." If the sensed data has a value of logic 1 for both Bit 1 and Bit 0, more programming is required and step 710 is repeated. Programming ceases at step 725 once it is sensed that the output of comparator 450 has changed state from logic 1 to logic 0. The decisional block for this operation is shown as step 720. If the output of comparator 455 is a logic 0, the flash cell is overprogrammed and it does not pass the write verify operation. The method of FIG. 8 thus ensures that neither underprogramming nor overprogramming occurs.

Figure 9:
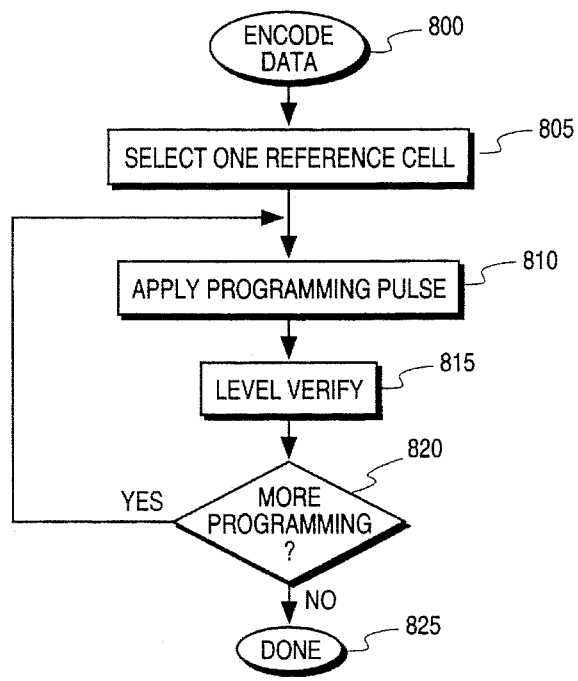
FIG. 9 is a flow chart for performing a level verify write verify method.

Another method for a write verify operation is shown in FIG. 9. This method uses a single unprimed PV reference cell to perform the write verify operation. The external data is received and encoded at step 800. The lower bounding PV reference cell for the desired state is selected via the signal line 85 at step 805. Step 810 is identical to step 710 of FIG. 8. At step 815, the data of the selected cell is verified by only monitoring the output of comparator 450. At step 820, the control engine 80 determines if additional programming of the selected flash cell is required by. If the output of the comparator 450 indicates that the selected flash cell has a $V_t$ less than the program verify voltage of the program verify reference flash cell, more programming is needed. Programming ceases at step 825 when the sensed $V_t$ value of the selected flash cell is a greater than that of the reference flash cell. The expected output of comparator 450 to pass programming for this embodiment is shown in Table 3. If the coupling of the selected flash cell and the reference flash cell to the comparator 450 is reversed such that the selected flash cell is coupled to the positive terminal and the reference flash cell is coupled to the negative terminal, the expected output is a logic 1.

TABLE 3

| LEVEL | REFERENCE FOR COMPARATOR 450 | OUTPUT TO PASS PROGRAM |
|---|---|---|
| STATE 1 | $V_{PV1}$ | 0 |
| STATE 2 | $V_{PV2}$ | 0 |
| STATE 3 | $V_{PV3}$ | 0 |
| STATE 4 | $V_{PV4}$ | 0 |

Figure 10:
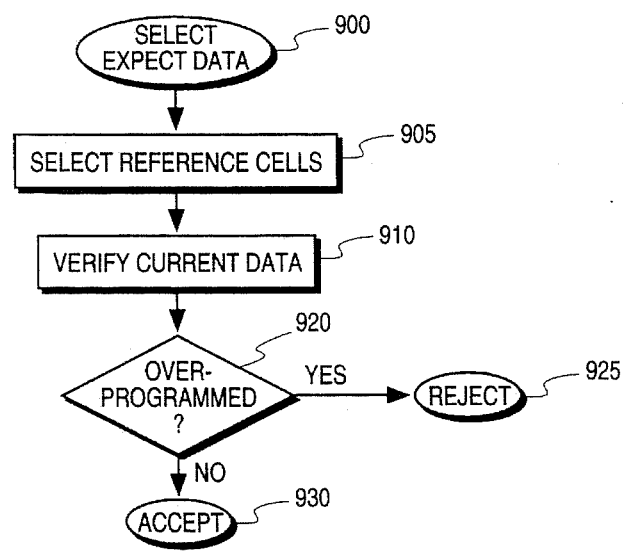
FIG. 10 is a flow chart for performing an overprogram sense method.

The PV reference flash cells may also be used in other applications. For example, as shown in FIG. 10, the PV reference flash cells may be used to perform an overprogram sense operation to determine whether a selected flash cell is overprogrammed. At step 900, the expected data is received by the control engine 80, which selects the appropriate primed PV reference flash cell corresponding to the upper boundary of the desired state. The data of the flash cell is sensed using the primed PV reference flash cell at step 915. At step 920, the control engine determines whether the selected flash cell is overprogrammed. If the output of the comparator 455 indicates that the sensed $V_t$ of the selected flash cell is greater than the $V_t$ of the primed PV reference flash cell, the selected flash cell is overprogrammed and the cell is rejected at step 425. If the output of the comparator 450 indicates that the sensed $V_t$ of the selected flash cell is less than the $V_t$ of the primed PV reference flash cell, the selected flash cell is properly programmed, and the selected flash cell passes the overprogram sense operation. In this embodiment, the selected flash cell will pass if the output of comparator 450 is a logic 1 and will fail if the output of the comparator 450 is a logic 0. Reversing the coupling of the selected and reference flash cells to the comparator 450 results in a passing flash cell being indicated by a logic 0.

Figure 11:
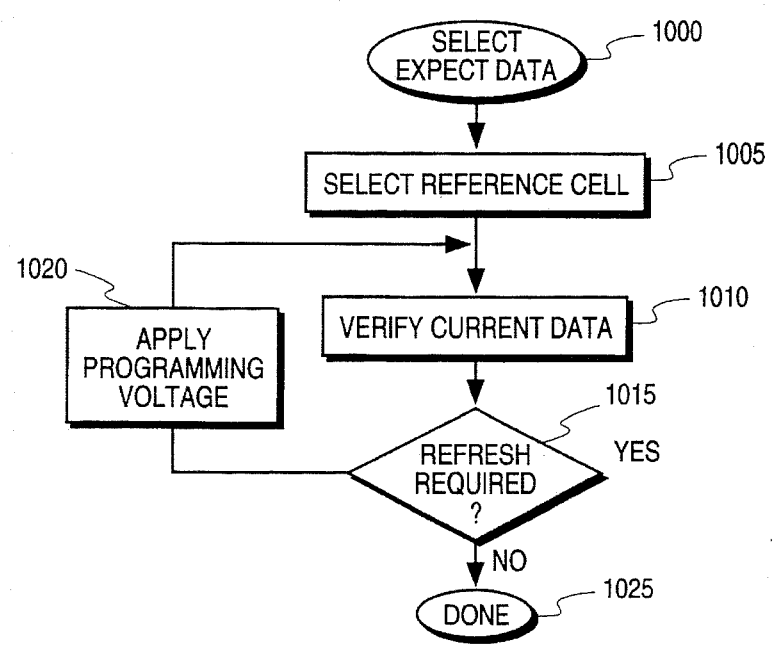
FIG. 11 is a flow chart for performing a refresh method.

FIG. 11 is a flow chart for a flash cell refresh method according to one embodiment. Over time, it is possible that leakage may result in charge loss for the floating gate of a flash cell such that the $V_t$ of the flash cell is no longer within the bounds of its programmed state as defined by the unprimed and primed PV reference voltages. It is also possible that a flash cell may incorrectly pass a first write verify operation and later fail a subsequent write verify operation. To address these problems, a refresh mechanism may be provided. The expected data is received by the control engine 80 at step 1000. Like the write verify methods, the refresh method may be done using either one or two PV reference flash cells. If one reference flash cell is used, it is preferably the unprimed PV reference flash cell that is the lower bound of the desired state. If two reference flash cells are used, the read reference flash cell of the separation range below the desired state and the unprimed PV reference cell of the desired state are used. The selection of the appropriate reference flash cell or cells is performed at step 1005. At step 1010, the data of the selected flash cell is verified. At step 1015, the control engine determines whether a refresh of the selected flash cell is required. If the output of the comparator that is coupled to the unprimed PV reference flash cell is a logic 1, refresh is required, and a programming pulse is applied to the selected flash cell at step 1020. If the output of the comparator that is coupled to the unprimed PV reference flash cell is a logic 0, no refresh is required and the refresh operation is completed at step 1025.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. In a memory device including at least one memory cell having a voltage level that indicates one of n possible states, where n is greater than 2, each state corresponding to a predetermined range of threshold voltage levels, a method for verifying successful programming of the memory cell to a desired state, the method comprising the steps of:

selecting a first reference, the first reference corresponding to a first threshold voltage level that defines a first lower bound of a first state;

selecting a second reference, the second reference corresponding to a second threshold voltage level that defines a second lower bound of a second state;

selecting a third reference, the third reference corresponding to a third threshold voltage level that defines a third lower bound of a third state;

applying a programming voltage to the memory cell;

sensing the threshold voltage level of the memory cell;

comparing the threshold voltage level of the memory cell to the first reference;

outputting a first result of comparing the threshold voltage level of the memory cell to the first reference;

comparing the threshold voltage level of the memory cell to a selected one of the second reference and the third reference, a selection between the second and third references being made in response to the first result;

outputting a second result of comparing the threshold voltage level of the memory cell to the selected one of the second reference and the third reference;

comparing the first result and the second result to an expected value, the expected value indicating the desired state; and indicating successful programming if the first result and the second result are equal to the expected value.

2. The method of claim 1, wherein the step of comparing the threshold voltage level of the memory cell to the one of the second reference and the third reference includes the further steps of:

comparing the threshold voltage level of the memory cell to the second reference if the threshold voltage level of the memory cell is less than the first reference as indicated by the first result; and comparing the threshold voltage level of the memory cell to the third reference if the threshold voltage level of the memory cell is greater than the first reference as indicated by the first result.

3. The method of claim 2, wherein the method further comprises the steps of:

repetitively and sequentially performing the steps of applying the programming voltage to the memory cell, comparing the threshold voltage level of the memory cell to the first reference, outputting the first result, comparing the threshold voltage level of the memory cell to the selected one of the second reference and the third reference, outputting the second result, and comparing the first result and the second result to the expected value until the first result and the second result are equal to the expected value if the first result and the second result are not equal to the expected value.

4. In a memory device including at least one memory cell having a threshold voltage level that indicates one of n possible states, where n is greater than 2, each state corresponding to a predetermined range of threshold voltage levels, a method for verifying successful programming of the memory cell to a desired state, the method comprising the steps of:

selecting a first reference, the first reference corresponding to a first voltage that defines a lower bound of the predetermined range of threshold voltage levels for the desired state;

selecting a second reference, the second reference corresponding to a second voltage that defines an upper bound of the predetermined range of threshold voltage levels for the desired state;

applying a programming voltage to the memory cell;

sensing the threshold voltage level of the memory cell;

comparing the threshold voltage level of the memory cell to the first reference;

comparing the threshold voltage level of the memory cell to the second reference; and indicating that the memory cell is programmed to the desired state if the threshold voltage level of the memory cell is greater than the first reference and less than the second reference.

5. The method of claim 4, wherein the method further comprises the steps of:

if the threshold voltage level of the memory cell is less than the threshold voltage level of the first reference, sequentially and repetitively applying a programming voltage to the memory cell and comparing the threshold voltage level of the memory cell to the first and second references until the threshold voltage level of the memory cell is greater than the threshold voltage level of the first reference.

6. The method of claim 5, wherein the method further includes the step of:

indicating that the memory cell is overprogrammed if the threshold voltage level of the memory cell is greater than the second reference.

7. The method of claim 6, wherein the method further includes the step of:

receiving data, the data indicating the desired state of the memory cell, wherein the steps of selecting the first reference and selecting the second reference are performed in response to the data received.

8. In a memory device including at least one memory cell having a threshold voltage level that indicates one of n possible states, where n is greater than 2, each state corresponding to a predetermined range of threshold voltage levels, a method for verifying successful programming of the memory cell to a desired state, the method comprising the steps of:

selecting a first reference, the first reference defining a lower bound of the predetermined range of threshold voltage levels for the desired state;

applying a programming voltage to the memory cell;

sensing the threshold voltage level of the memory cell;

comparing the threshold voltage level of the memory cell to the first reference;

indicating that the memory cell is programmed to the desired state if the threshold voltage level of the memory cell is greater than the first reference.

9. The method of claim 8, wherein the method further comprises the steps of:

sequentially and repetitively applying the programming voltage to the memory cell and comparing the threshold voltage level of the memory cell to the first reference until the threshold voltage level of the memory cell is greater than the threshold voltage level of the first reference if the threshold voltage level of the memory cell is less than the threshold voltage level of the first reference.

10. In a memory device including at least one memory cell having a threshold voltage level that indicates one of n possible states, where n is greater than 2, each state corresponding to a predetermined range of threshold voltage levels, a method for whether the memory cell is overprogrammed, the method comprising the steps of:

selecting a first reference, the first reference corresponding to a first voltage that defines an upper bound of the predetermined range of threshold voltage levels for the desired state;

sensing the threshold voltage level of the memory cell;

comparing the threshold voltage level of the memory cell to the first reference;

indicating that the memory cell is overprogrammed if the threshold voltage level of the memory cell is greater than the first reference.

11. In a memory device including at least one memory cell having a threshold voltage level that indicates one of n possible states, where n is greater than 2, each state corresponding to a predetermined range of threshold voltage levels, a method for refreshing the memory cell to place the memory cell in a desired state, the method comprising the steps of:

selecting a first reference, the first reference defining a lower bound of the predetermined range of threshold voltage levels for the desired state;

sensing the threshold voltage level of the memory cell;

comparing the threshold voltage level of the memory cell to the first reference;

sequentially and repetitively applying a programming voltage to the memory cell and comparing the threshold voltage level of the memory cell to the first reference until the threshold voltage level of the memory cell is greater than the threshold voltage level of the first reference if the threshold voltage level of the memory cell is less than the threshold voltage level of the first reference.

12. In a memory device including at least one memory cell having a threshold voltage level that indicates one of n possible states, where n is greater than 2, each state corresponding to a predetermined range of threshold voltage levels, a write verify circuit for verifying successful programming of the memory cell to a desired state, the write verify circuit comprising:

a plurality of read references, each read reference corresponding to a read voltage between states;

a first reference, the first reference corresponding to a first voltage that defines a first lower bound of a first state;

a second reference, the second reference corresponding to a second voltage that defines a second lower bound of a second state;

a third reference, the third reference corresponding to a third voltage that defines a third lower bound of a third state;

a control engine coupled to the memory cell and to the first, second and third references for applying a programming voltage to the memory cell to program the memory cell to the desired state, for generating a select signal to select the first, second and third references to sense a present state of the memory cell, for comparing the present state to the desired state, and for indicating successful programming of the memory cell if the present state equals the desired state;

a sensing circuit coupled to the memory cell and the control engine, the sensing circuit being coupled to the first, second and third references in response to the select signal, the sensing circuit for sensing the present state of the memory cell, the sensing circuit including:

a first comparator coupled to the memory cell, the control engine and the first reference, the first comparator for comparing a cell threshold voltage level corresponding to the memory cell to the first reference, and for outputting a first result to the control engine;

a second comparator coupled to the memory cell, the control engine and a selected one of the second reference and the third reference, the second comparator for comparing the cell threshold voltage level to the selected one of the second reference and the third reference, and for outputting a second result to the control engine, wherein the first and second results indicate the present state; and a selector circuit coupled for receiving the first result, the selector circuit for selectively coupling the one of the second reference and the third reference to the second comparator in response to the first result.

13. The write verify circuit of claim 12, wherein the selector circuit couples the second reference to the second comparator if the cell threshold voltage level is greater than the first threshold voltage level.

14. The write verify circuit of claim 13, wherein the selector circuit couples the third reference to the second comparator if the cell threshold voltage level is less than the first threshold voltage level.

15. The write verify circuit of claim 14, wherein each of the plurality of read references and the first, second and third references is a reference memory cell.

16. In a memory device including at least one memory cell having a threshold voltage level that indicates one of n possible states, where n is greater than 2, each state corresponding to a predetermined range of threshold voltage levels, a write verify circuit for verifying successful programming of the memory cell to a desired state, the write verify circuit comprising:

a plurality of read references, each read reference corresponding to a read voltage between states;

a first reference, the first reference corresponding to a first voltage that defines a lower bound of the desired state;

a second reference, the second reference corresponding to a second voltage that defines an upper bound of the desired state;

a control engine coupled to the memory cell and the first and second references for applying a programming voltage to the memory cell to program the memory cell to the desired state, and for generating a select signal to select the first and second references to sense a present state of the memory cell;

a sensing circuit coupled to the memory cell and the control engine, the sensing circuit being coupled to the first and second references in response to the select signal, the sensing circuit for sensing a cell voltage of the memory cell, the sensing circuit including:

a first comparator coupled to the memory cell, the control engine and the first reference, the first comparator for comparing the cell threshold voltage level to the first reference, and for asserting a first result signal to the control engine if the cell threshold voltage level is greater than the first reference;

a second comparator coupled to the memory cell, the control engine and the second reference, the second comparator for comparing the cell threshold voltage level to the second reference, and for asserting a second result signal to the control engine if the cell threshold voltage level is less than the second reference, wherein assertion of the first and second result signals indicates that the memory cell is successfully programmed.

17. The write verify circuit of claim 16, wherein each of the first and second references is a reference memory cell.

18. The write verify circuit of claim 16, wherein the desired state comprises a first value and a second value, the control engine for comparing the first result signal to the first value, and for applying the programming voltage if the first result signal is not equal to the first value.

19. In a memory device including at least one memory cell having a threshold voltage level that indicates one of n possible states, where n is greater than 2, each state corresponding to a predetermined range of threshold voltage levels, a write verify circuit for verifying successful programming of the memory cell to a desired state, the write verify circuit comprising:

a plurality of read references, each read reference corresponding to a read voltage between states;

a first reference, the first reference corresponding to a first voltage that defines a lower bound of the desired state;

a control engine coupled to the memory cell and the first reference for applying a programming voltage to the memory cell to program the memory cell to the desired state, and for generating a select signal to select the first reference to sense a present state of the memory cell;

a sensing circuit coupled to the memory cell and the control engine, the sensing circuit being coupled to the first reference in response to the select signal, the sensing circuit for sensing a cell voltage of the memory cell, the sensing circuit including:

a first comparator coupled to the memory cell, the control engine and the first reference, the first comparator for comparing the cell threshold voltage level to the first reference, and for outputting a result signal indicating that the memory cell is programmed to the desired state if the cell threshold voltage level is greater than the first reference.

20. The write verify circuit of claim 19, wherein the first reference is a reference memory cell.

21. The write verify circuit of claim 20, wherein the desired state comprises a first value, the control engine for comparing the first result to the first value, and for applying the programming voltage if the first result is not equal to the first value.

22. In a memory device including at least one memory cell having a threshold voltage level that indicates one of n possible states, where n is greater than 2, each state corresponding to a predetermined range of threshold voltage levels, a circuit for sensing if the memory cell is overprogrammed, the circuit comprising:

a plurality of read references, each read reference corresponding to a read voltage between states;

a first reference, the first reference corresponding to a first voltage that defines an upper bound of a desired state;

a control engine coupled to the memory cell and the first reference for generating a select signal to select the first reference to sense a present state of the memory cell;

a sensing circuit coupled to the memory cell and the control engine, the sensing circuit being coupled to the first reference in response to the select signal, the sensing circuit for sensing a cell voltage of the memory cell, the sensing circuit including:

a first comparator coupled to the memory cell, the control engine and the first reference, the first comparator for comparing the cell threshold voltage level to the first reference, and for outputting a result signal indicating that the memory cell is overprogrammed if the threshold voltage level of the memory cell is greater than the first reference.

23. The write verify circuit of claim 22, wherein the first reference is a reference memory cell.

24. The write verify circuit of claim 23, wherein the desired state comprises a first value, the control engine for comparing the first result signal to the first value, and for indicating that the memory cell is overprogrammed if the first result signal is not equal to the first value.

* * * * *